(12) United States Patent
Dean et al.

(10) Patent No.: US 8,816,884 B2
(45) Date of Patent: Aug. 26, 2014

(54) VECTORIZED REBINNING FOR FAST DATA DOWN-SAMPLING

(75) Inventors: Bruce H. Dean, New Market, MD (US);
Jeffrey S. Smith, Baltimore, MD (US);
David L. Aronstein, Silver Spring, MD (US)

(73) Assignee: USA as represented by the Administrator of the National Aeronautics Space Administration, Washington, DC (US)

( * ) Notice: Subject to any disclaimer, the term of this patent is extended or adjusted under 35 U.S.C. 154(b) by 41 days.

(21) Appl. No.: 13/600,992

(22) Filed: Aug. 31, 2012

(65) Prior Publication Data

US 2014/0062732 A1    Mar. 6, 2014

(51) Int. Cl.
*H03M 7/00*    (2006.01)

(52) U.S. Cl.
USPC .............................. 341/61; 381/128; 381/284

(58) Field of Classification Search
USPC ...................................... 341/61; 382/128, 284
See application file for complete search history.

(56) References Cited

U.S. PATENT DOCUMENTS 6,959,120 B1 *  10/2005  Zhang et al. .................. 382/284
7,409,077 B2 *  8/2008   Jones et al. ................... 382/128

* cited by examiner

*Primary Examiner* — Jean B Jeanglaude

(57) ABSTRACT

A rebinning device includes a rebinning engine that transforms signal data from a first format to a second format with vectorized binning. Moreover, a data storage operably coupled to the rebinning engine stores the signal data in the second format. The rebinning device may optionally includes a capturing engine that captures the signal data in the first format and a rendering engine that renders the signal data in the second format.

14 Claims, 6 Drawing Sheets

VECTORIZED REBINNING FOR FAST DATA DOWN-SAMPLING

ORIGIN OF INVENTION

Invention by Government Employee(s) Only

The invention described herein was made by an employee of the United States Government, and may be manufactured and used by or for the Government for governmental purposes without the payment of any royalties thereon or therefor.

FIELD

The aspects of the disclosed embodiments generally related to data rebinning, and more particularly, to vectorized rebinning devices and methods for computationally efficient data down-sampling.

BACKGROUND

Signal processing mainly concerns operations on or analysis of discrete or continuous signals. Signals are analog or digital electrical representations of time or spatial varying physical quantities, such as visual and audible signals. Data rebinning or down-sampling is a fundamental operation in digital signal processing as it is useful in reducing the amount of data while not necessarily losing all of the information required for a complete signal reconstruction. Data rebinning may be used for data compression, image processing, filter design, and anti-aliasing techniques.

The process of data rebinning can be computationally intensive, require substantial run-time even with modern computers. There are two known methods of rebinning of signal data. Taking image data as an example, the first method is the pixel by pixel down-sampling technique where the value for each pixel in the down-sampled image is calculated in stages, by averaging data from a certain range of rows and columns in the original image; the second method is the matrix down-sampling technique where the initial image is transformed into the down-sampled image with two matrix multiplications, one for down-sampling the rows and the other for down-sampling the columns.

These two methods both can be computationally intensive, in other words, require substantial CPU cycles, thus runtime. Moreover, the matrix down-sampling method can require substantial computer memory to store the matrices used to perform the down-sampling. As a result of these computationally inefficient approaches, there is a need to advance the art in this field in order to more efficiently implement data rebinning, at least in terms of runtime and memory usage.

Accordingly, it would be desirable to provide a data rebinning system and method that addresses at least some of the problems identified above.

BRIEF DESCRIPTION OF THE DISCLOSED EMBODIMENTS

As described herein, the exemplary embodiments overcome one or more of the above or other disadvantages known in the art.

Briefly, the present disclosure provides vectorized rebinning devices and methods for rapid data down-sampling.

One aspect of the exemplary embodiments relates to a rebinning device. In one embodiment, the rebinning device includes a rebinning engine that transforms signal data from a first format to a second format with vectorized binning. Moreover, a data storage operably coupled to the rebinning engine stores the signal data in the second format. The rebinning device may optionally include a capturing engine that captures the signal data in the first format and a rendering engine that renders the signal data in the second format.

Another aspect of the exemplary embodiments relates to a computer-implemented method of data rebinning. In one embodiment, the method includes dividing signal data in a first format to operable units. Moreover the method includes rebinning the signal data in each operable unit to a second format. Furthermore the method includes merging the signal data in the second format.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the present disclosure, and together with the general description given above and the detailed description given below, serve to explain the principles of the present disclosure. As shown throughout the drawings, like reference numerals designate like or corresponding parts.

DETAILED DESCRIPTION OF THE EXEMPLARY EMBODIMENTS OF THE DISCLOSURE

The present disclosure is generally directed towards vectorized rebinning devices and methods for rapid data down-sampling. As will be understood, the various diagrams, flow charts and scenarios described herein are only examples, and there are many other scenarios to which the present disclosure will apply.

Figure 1:
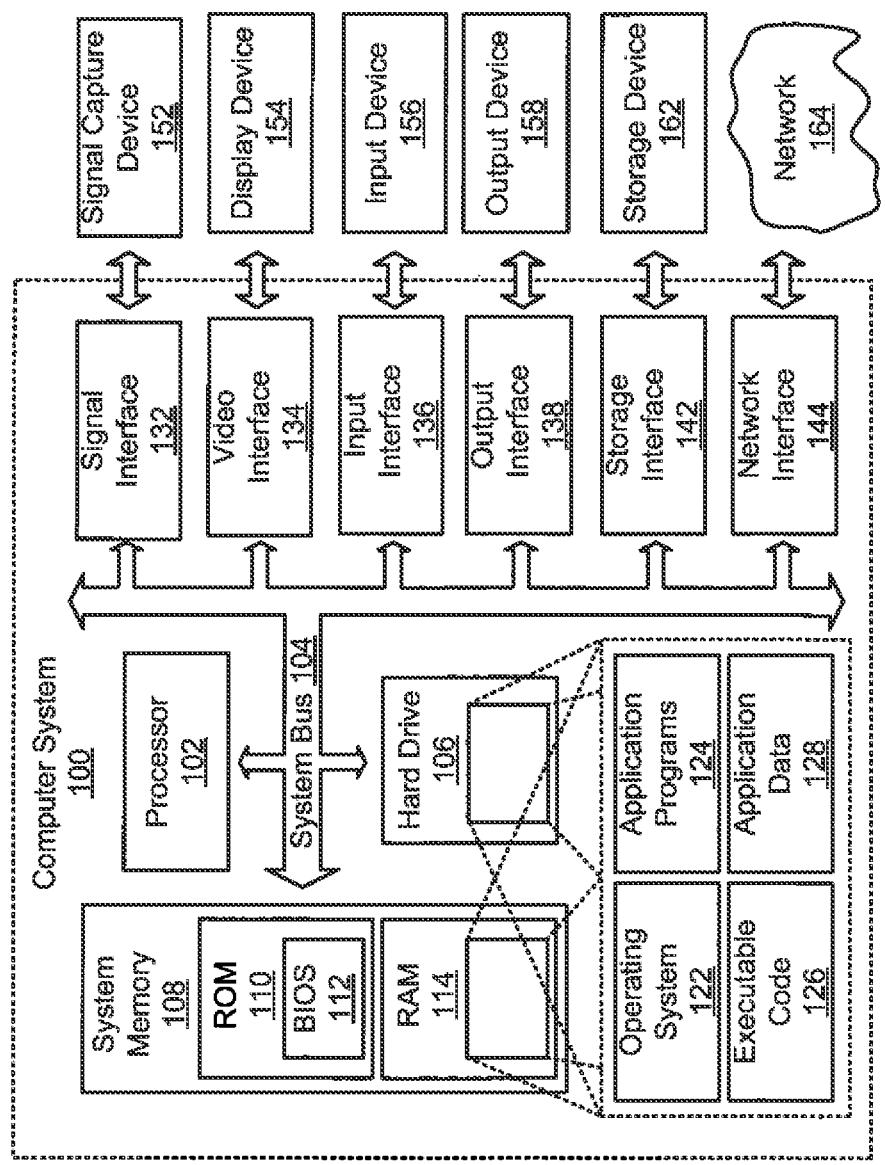
FIG. 1 is a block diagram generally representing a computer system into which aspects of the present disclosure may be incorporated.

Turning to FIG. 1 of the drawings, there is shown a block diagram generally representing a computer system into which aspects of the present disclosure may be incorporated. Computing system 100 may be based a personal computer (PC) as shown in this example. In other examples computing system may take the form of a special-purpose device, an appliance, a handheld computing device, a cellular telephone device, a pager device, etc.

As shown, computing system 100 includes processor 102, hard drive 106, and system memory 108. These system components may communicate with each other via system bus 104. System bus 104 may be any of several types of bus structures including a memory bus or memory controller, a peripheral bus, and a local bus using any of a variety of bus architectures.

System memory 108 typically includes read only memory (ROM) 110 and random access memory (RAM) 114. ROM 110 generally contains a basic input/output system 112 (BIOS) which commonly provides basic routines needed during the start-up of computer system 100. ROM 110 is generally non-volatile while RAM 114 is often associated with volatile types of memory where its stored information is lost without power. Therefore, RAM 114 typically load operating system 122, one or more application programs 124, executable code 126, and application data 128 from hard drive 106 which is a type of nonvolatile storage media.

Computing system 100 further includes signal interface 132, video interface 134, input interface 136, output interface 138, storage interface 142, and network interface 144 wherein interfaces may facilitate computer system 100 to communicate with various external devices to perform various functions.

Signal capture device 152 may capture signals representing time or spatial varying physical quantities. Signals of interest can include visual signals, audible signals, radio waves, and various sensor data, such as electrocardiograms, control system signals, telecommunication transmission signals, etc. Therefore, signal capture device 152 may be in the form of a camera, a video camera, a recorder, an EKG/ECG diagnostic instrument, a computed tomography scanner, a radio transmitter, a radio receiver, etc. Signals of interest are inputted into computing system 100 via signal interface 132. It is noted, however, that signal data can be input into computing system 100 from any of computer-readable media as well including hard drive 106 or any external storage device, without requiring the use of signal capture device 152.

A display device 154, such as a monitor, may be connected to the system bus 104 via the video interface 134. Therefore, display device 154 may serve as an electronic visual display for computer system 100. It is noted that a touchscreen may use touching of the screen as an input method to select, unselect, move, activate, or deactivate objects displayed on the touchscreen. Thus, display device 154 may alternatively serve as an input device beyond its traditional function for visual display.

However, traditionally a user may enter commands and information into computing system 100 via various input device 156 such as a keyboard, a pointing device, electronic digitizer, a microphone, etc. Input device 156 is connected to the system bus 104 via the input interface 136.

In addition to display device 154, computing system 100 may generate output through other peripheral output devices 158, such as speakers, printers, etc. Output device 158 is connected to the system bus 104 via the output interface 138.

Storage device 162 may provide extended storage to computer system. 100 via the storage interface 142. Storage device 162 may access to a variety of computer-readable volatile or nonvolatile computer storage media, such as compact disc (CD), digital versatile disks (DVD), blu-ray disc (BD), magnetic cassette, magnetic tape, magnetic disk storage, or any other medium which can be used to store computer readable instructions, data structures, computer programs and other data.

Computing system 100 may operate in a networked environment via network interface 144. Computing system 100 may access one or more remote computers through network 164. Network 164 may include a local area network (LAN), a wide area network (WAN), or other types of network. In a networked environment, application programs and program data may be stored in and processed by a remote computer or a remote network. Thus the computer system 100 may be a centralized or a distributed system. Those skilled in the art will also appreciate that the computer system 100 may even be embedded within a system-on-a-chip architecture including memory, external interfaces and an operating system. It will be appreciated that the network connections shown are exemplary and other means of establishing a communications link between the computers may be used.

Figure 2:
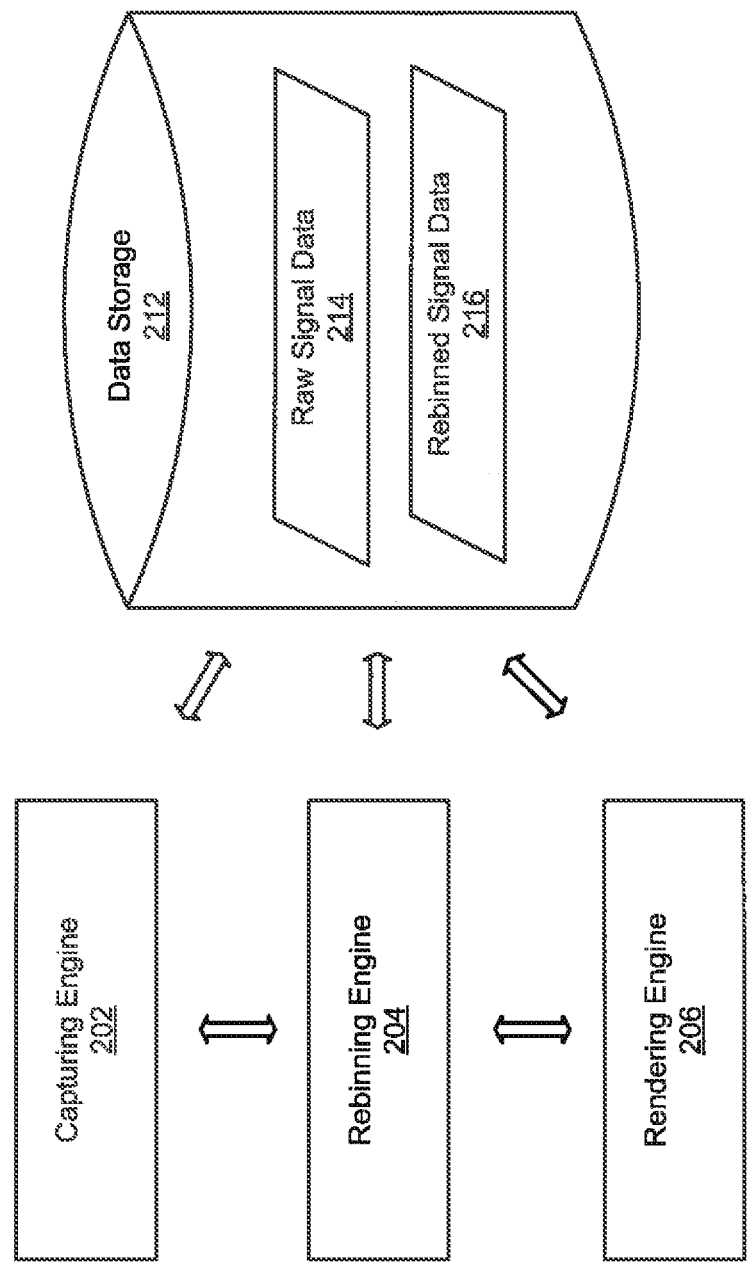
FIG. 2 is a block diagram generally representing an exemplary architecture of system components for processing signal data incorporating aspects of the present disclosure.

Now turning to FIG. 2, there is a block diagram generally representing an exemplary architecture of system components for processing signal data incorporating aspects of the present disclosure. In various embodiments, capturing engine 202 may be a computer such as computer system 100 of FIG. 1, a component in a computer such as signal capture device 152 in FIG. 1, or another computing device including a mobile device. Capturing engine 202 may include functionality for capturing signals representing time or spatial varying physical quantities. Rebinning engine 204 is operably coupled to capturing engine 202 and may also be a computer such as computer system 100 of FIG. 1 or a component in a computer such as a special purpose application. Rebinning engine 204 may include functionality for transforming signal data from a first format to a second format with vectorized binning. Rendering engine 206 is operably coupled to rebinning engine 204 and may similarly be a computer such as computer system 100 of FIG. 1 or a component in a computer such as a special purpose application. Rendering engine 206 may include functionality for rendering signal data to a human viewable representation such as displaying an image on a monitor.

Data storage 212 may be a computer such as computer system 100 of FIG. 1 or a component in a computer such as a database. Data storage 212 may store raw signal data 214 and rebinned signal data 216. Data storage 212 is operably coupled to capturing engine 202, rebinning engine 204, and rendering engine 206. Therefore, raw signal data 214 and rebinned signal data 216 may be accessible to each engine to facilitate their respective functionality.

Those skilled in the art will appreciate that the functions implemented within the blocks illustrated in the diagram may be implemented as separate components or the functions of several or all of the blocks may be implemented within a single component.

Figure 3:
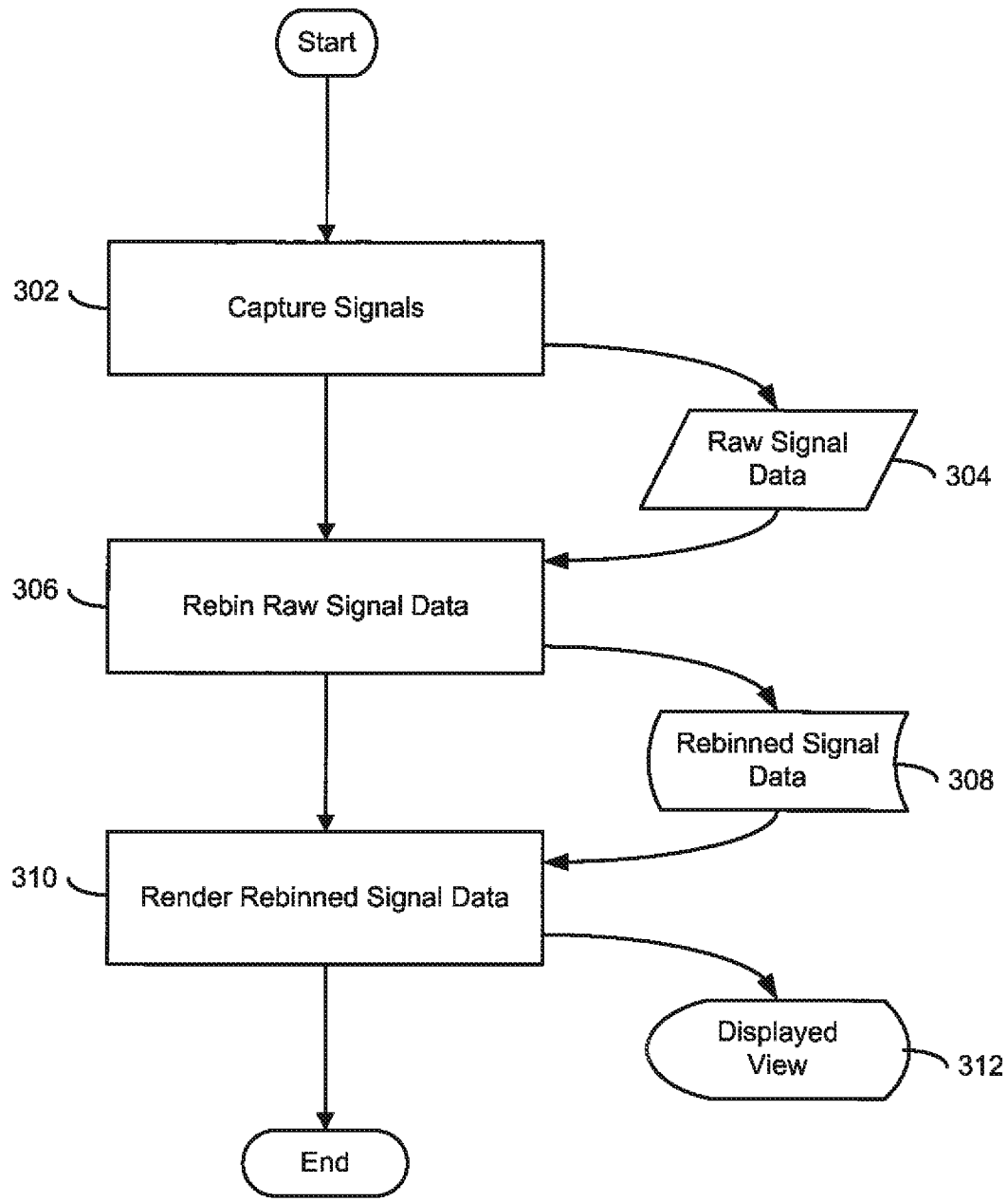
FIG. 3 illustrates a flowchart of a process flow of an exemplary embodiment for processing signal data incorporating aspects of the present disclosure.

Now turning to FIG. 3, it illustrates a flowchart of a process flow of an exemplary embodiment for processing signal data incorporating aspects of the present disclosure. As indicated at process block 302, signal data representing time or spatial varying physical quantities is captured. Signals of interest can include visual signals, audible signals, radio waves, and various sensor data, such as electrocardiograms, control system signals, telecommunication transmission signals, etc. Process block 302 may be carried out in a different time with other process blocks in FIG. 3 because signal data may be stored in raw signal data 304 and be used later. Therefore, signal data may be directly or indirectly provided to the process block 306.

In process block 306, raw signal data is rebinned. Data rebinning or down-sampling is a procedure that uses a discretely sampled N-dimensional data set to create a representation of the same data, but with fewer discrete samples. Such data down-sampling is fundamental to digital signal processing, e.g., for data compression applications. Additional applications include image processing, filter design, and anti-aliasing techniques. The output from the process block 304 may be stored in rebinned signal data 308. Similarly, signal data now may be directly or indirectly provided to the process block 310.

Accordingly, in process block 310, rebinned signal data may be rendered to become displayed view 312. It will be appreciated that raw signal data may be transformed in the process block 306 to become several order of magnitude smaller. Thus rebinned signal data 308 may take less space to store and be transmitted easily through networking from one location to another, more importantly, resulting in less data for rendering engine 206 to interpret and thus faster rendering film.

Figure 4:
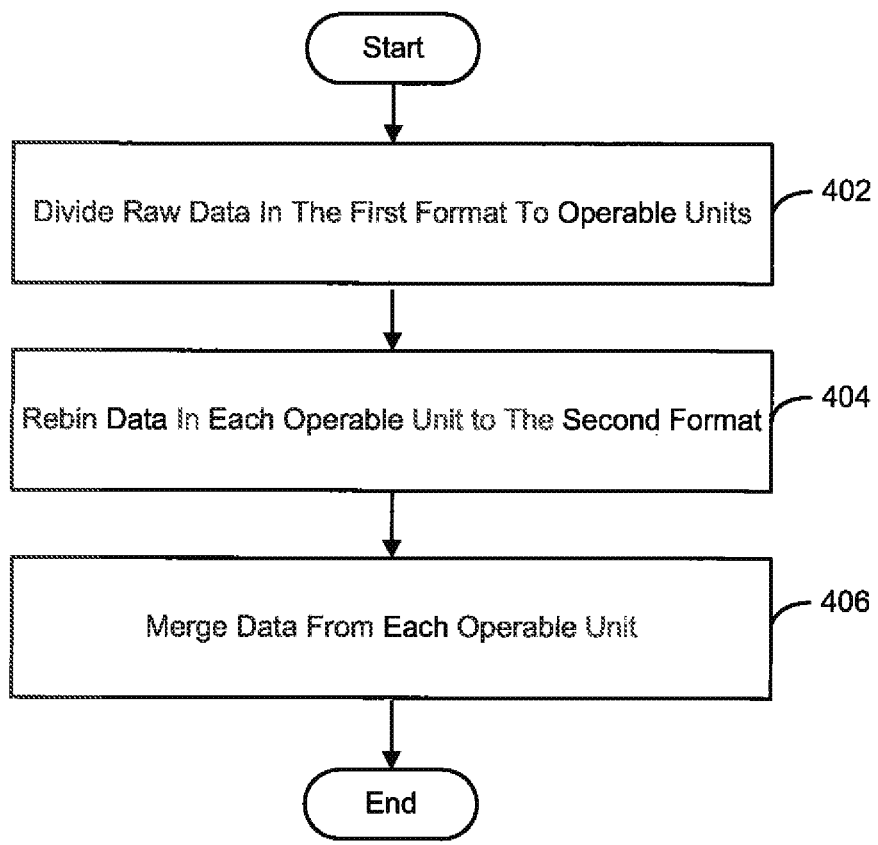
FIG. 4 illustrates a flowchart of a process flow of an exemplary embodiment for rebinning signal data incorporating aspects of the present disclosure.

Now turning to FIG. 4, it illustrates a flowchart of a process flow of an exemplary embodiment for rebinning signal data incorporating aspects of the present disclosure. As indicated at process block 402, raw data in a first format is divided into operable units. In one embodiment, the first format may be the current representation of the data. Preferably, the size of each operable unit is determined by the targeted down-sampling ratio. The down-sampling ratio is proportional to the size of operable unit. In other words, a larger down-sampling ratio requires the operable unit to be larger. In another embodiment, a convenient size of operable unit may be selected, and iterative approach may be adopted to achieve a targeted down-sampling ratio.

In process block 404, data in each operable unit is rebinned to the second format. Block 404 comprises vectorized data binning. This vectorized rebinning is applicable to N-dimensional data sets and offers a significant reduction in computer runtime when compared to conventional rebinning techniques. For example, with a 2-dimensional dataset, the down-sampling procedure is done as a single step over all data rows, and then as a single step over all data columns. A typical operation here is to compute the mean of data in each operable unit. The operation reported here fully "vectorizes" the data rebinning operation. Using a high-level computing language such as MATLAB, this approach is able to take advantage of vectorized instructions, such as single instruction multiple data (SIMD), to perform the rebinning operation.

The operation in process block 404 completely vectorizes the data rebinning operation, in the sense that a single arithmetic operation is applied simultaneously to multiply distinct data sets and is executed with the approximate run-time of that operation applied to a single data set. For lower level computer languages, such as C or assembly, vectorized operations can be implemented using central processing unit (CPU) single instruction, multiple data (SIMD) capabilities, such as streaming SIMD Extensions 3 (SSE3) on x86 computer architecture or AltiVec on PowerPC processors.

In general, data rebinning methods are often optimized by trading "decreased run-time" for "increased memory," where the latter is needed for storing additional code, pre-computed results, or other ancillary data. However, the vectorized rebinning approach according to the present disclosure does not have increased memory requirements compared to conventional approaches due to one of its underlying fundamental advantages that is to utilize vectorized instructions for the rebinning operation.

Data rebinning is a fundamental operation of digital signal processing. Although data rebinning can be computationally intensive, vectorized rebinning is a more efficient approach with reduced run-times, as compared to existing rebinning approaches. Commercial products utilizing data rebinning or down-sampling procedures, such as image processing, anti-aliasing techniques, and data compression can benefit from aspects of this disclosure by having faster run-times or equivalently, reduced latency between data collection and final data processing.

Finally, in process block 406, data from each operable unit is merged to form a completed representation of the underlying physical entity again albeit in a compact form with less details.

Figure 5:
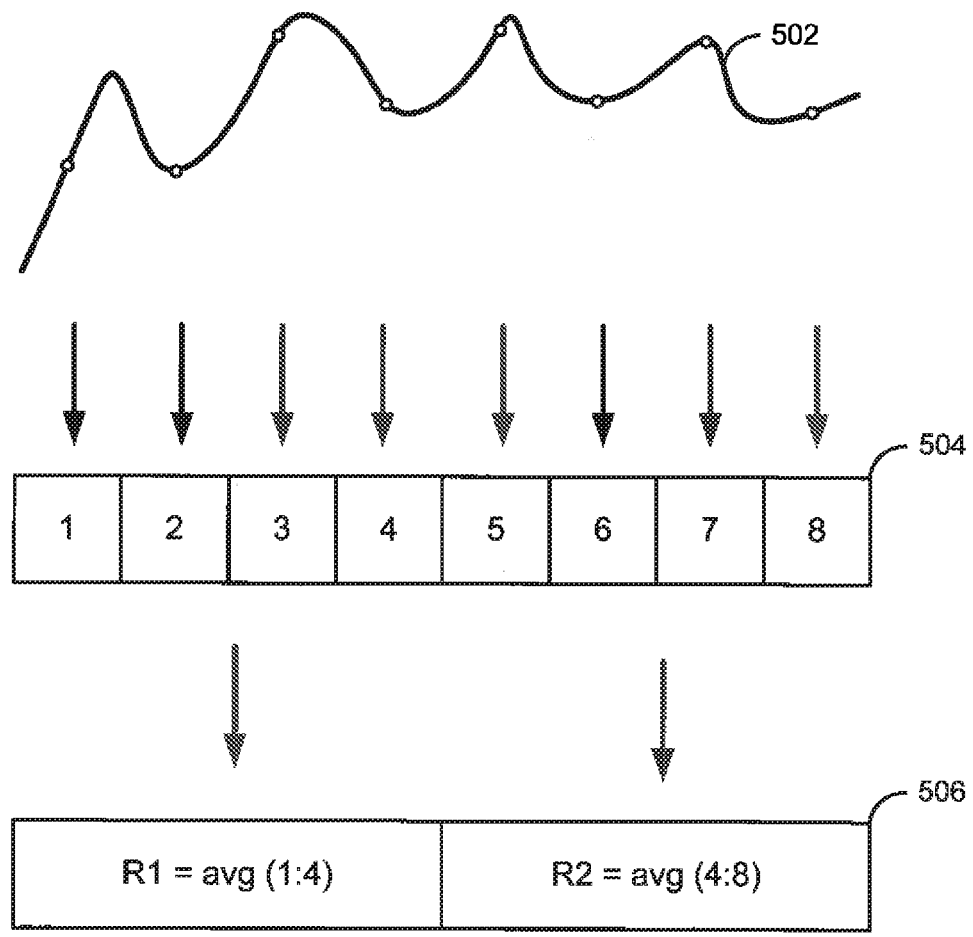
FIG. 5 is a graphical representation generally illustrating a 1-d rebinning process incorporating aspects of the present disclosure.
Figure 6:
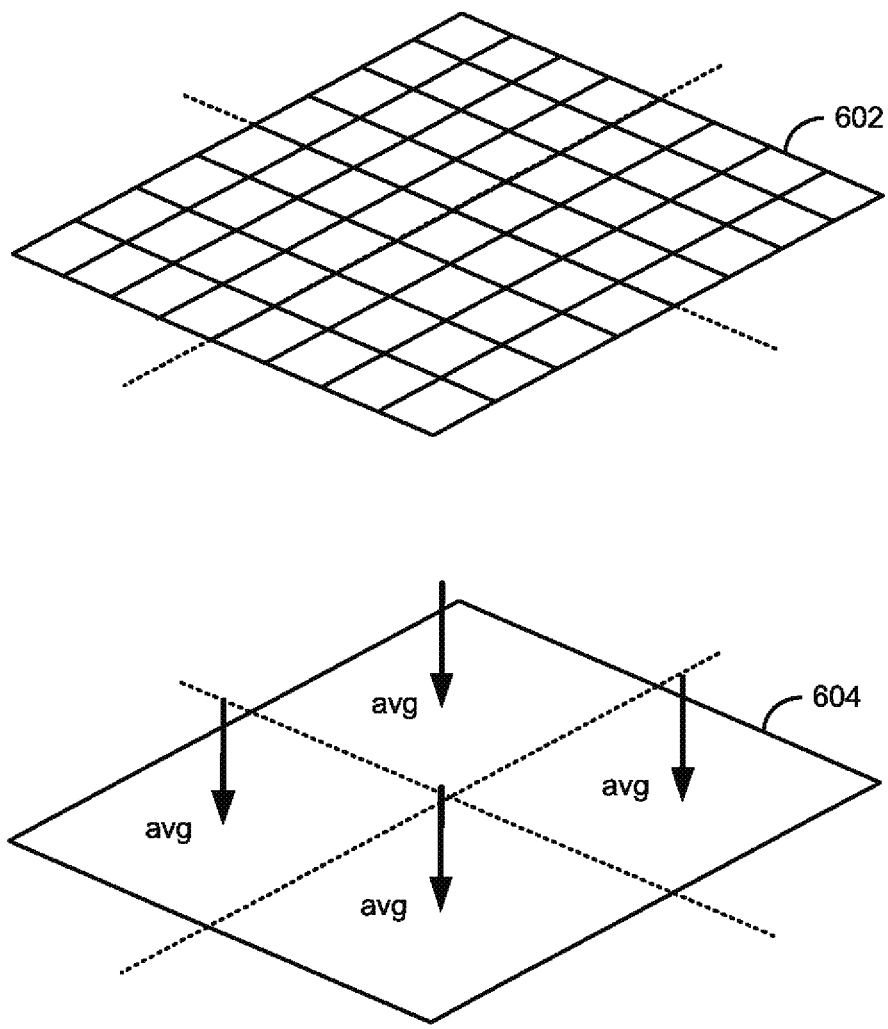
FIG. 6 is a graphical representation generally illustrating a 2-d rebinning process incorporating aspects of the present disclosure.

Now turning to FIG. 5, there is a graphical representation generally illustrating a 1-D rebinning process incorporating aspects of the present disclosure. In one embodiment, data 502 representing a piece of continues or analog signal sample. For example, data of electrical current or voltage waveforms converted by a transducer from signals of other physical waveforms. Data 504 illustrates the initial digital representation of data 502. For example, data 502 is processed and transmitted as electromagnetic waves, received and converted by another transducer to its digital form as data 504. Data 506 is the vectorized down-sample of data 504 processed through a 1-D rebinning process. In the standard rebinning approach, the 1-D rebinning process may be illustrated by the following high-level description of the operating principle, showing an execution through stages:

data=input_data;
    for j=1:iterations
    I=(data(1:2:length(data_start)−1)+data(2:2:length(data)))/2;
    data=I
    end
    I_final=I;

In a 1-D rebinning process, an embodiment according to the present disclosure can eliminate the use of for-loops shown above with sequential data access and replace these using high-level vector instructions applied to columns of data, after reshaping the 1-d data array into a number of columns; this number of columns that matches the number of desired final data samples. Finally, a vector add is applied to the columns. In pseudocode, the process is as follows:

starting_pixels=length(data);
    final_pixels=specified at run-time;
    intervals=starting_pixels/final_pixels;
    data_downsampled=mean(reshape(data,[intervals,final_pixels]));

Now turning to FIG. 6, there is a graphical representation generally illustrating a 2-D rebinning process incorporating aspects of the present disclosure. This vectorized rebinning is applicable to N-dimensional data sets. For clarity, 2-dimensional data rebinning is discussed here to illustrate some specific details of the technique. Data 602 is divided into four quadrants. Data in each quadrant is averaged in one operation through the vectorized rebinning process. Finally, rebinned data is merged to become a completed down-sample 604. In one embodiment, this vectorized rebinning approach on 2-D data may outperform the standard rebinning approach based on for-loops by a factor of approximately 60. In another embodiment, this vectorized rebinning approach on 2-D data is about 20 times faster in run-time performance than the matrix-multiplication approach.

In a 2-D rebinning process according to the present disclosure, a vectorized instruction, which operates in multiple data values simultaneously, may be used for averaging each column, and in turn, a vectorized instruction for averaging each row. The operations for 2-D rebinning are similar to that shown above for the 1-D case except that the data is reshaped into a 3-D cube before the vector averages are applied. In general, the operations for N-D rebinning are also similar to that shown above for the 1-D case except that the data is reshaped into a (N+1)-D cube before the vector averages are applied.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit or scope of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A non-mosaic rebinning device,
   comprising: a rebinning engine that transforms signal data from
   a first format to a second format with vectorized binning; and
   a data storage operably coupled to the rebinning engine that stores the signal data in the second format wherein the rebinning engine further comprises multiple downsampled 2 dimensional engines producing a 3 dimensional cube.

2. A device in accordance with claim 1, further comprising a capturing engine that captures the signal data in the first format.

3. A device in accordance with claim 1, further comprising a rendering engine that renders the signal data in the second format.

4. A device in accordance with claim 1, wherein the rebinning engine applies one or more vectorized instructions on the signal data in the first format.

5. A device in accordance with claim 1, wherein the rebinning engine divides the signal data in the first format to a plurality of data sets.

6. A device in accordance with claim 5, wherein the data sets are distinct.

7. A device in accordance with claim 5, wherein the rebinning engine simultaneously executes a single arithmetic operation on the plurality of data sets within a length of time.

8. A device in accordance with claim 7, wherein the length of time is approximately same as if executing the single arithmetic operation on a single data set.

9. A non-mosaic computer implemented method of data rebinning, comprising: dividing signal data in a first format to operable units; rebinning the signal data in each operable unit to a second format; and merging the signal data in the second format from the each operable unit wherein the rebinning step further comprises the steps of multiple downsampling 2 dimensional engines and producing a 3 dimensional cube.

10. The method of claim 9 wherein rebinning data comprises vectorized data binning.

11. The method of claim 9 wherein rebinning data comprises applying one or more vectorized instructions on the signal data in the first format.

12. The method of claim 9 wherein rebinning data comprises simultaneously executing a single arithmetic operation on a plurality of data sets within a length of time.

13. The method of claim 12 wherein the data sets are distinct.

14. The method of claim 12 wherein the length of time is approximately same as if executing the single arithmetic operation on a single data set.

* * * * *